(12) United States Patent
Yokoi

(10) Patent No.: US 10,337,236 B2
(45) Date of Patent: Jul. 2, 2019

(54) AIRCRAFT WINDOW ASSEMBLY INCLUDING AN ELECTROMAGNETIC SHIELD, A CLOSING MEMBER INCLUDING AN ELECTROMAGNETIC SHIELDING PROPERTY, AND AN AIRCRAFT INCLUDING AN IMPROVED ELECTROMAGNETIC SHIELD

(71) Applicant: MITSUBISHI AIRCRAFT CORPORATION, Aichi (JP)

(72) Inventor: Takashi Yokoi, Aichi (JP)

(73) Assignee: MITSUBISHI AIRCRAFT CORPORATION, Aichi (JP)

(*) Notice: Subject to any disclaimer, the term of this patent is extended or adjusted under 35 U.S.C. 154(b) by 485 days.

(21) Appl. No.: 14/465,007

(22) Filed: Aug. 21, 2014

(65) Prior Publication Data
US 2015/0060603 A1    Mar. 5, 2015

(30) Foreign Application Priority Data

Aug. 30, 2013  (JP) .................................. 2013-179867

(51) Int. Cl.
*E06B 5/18*      (2006.01)
*B64C 1/14*      (2006.01)
(Continued)

(52) U.S. Cl.
CPC .............. *E06B 5/18* (2013.01); *B64C 1/1492* (2013.01); *B64D 45/02* (2013.01); *E06B 3/62* (2013.01);
(Continued)

(58) Field of Classification Search
CPC ... B64C 1/1476; B64C 1/1484; B64C 1/1492; H05K 9/0005; H05K 9/0094;
(Continued)

(56) References Cited

U.S. PATENT DOCUMENTS 4,204,374 A * 5/1980 Olson ..................... B32B 27/08
                                                       244/121
4,412,255 A * 10/1983 Kuhlman ................. H05K 9/00
                                                       174/389
(Continued)

FOREIGN PATENT DOCUMENTS

JP    S62-112881 A    5/1987
JP    2003-523911 A   8/2003
(Continued)

OTHER PUBLICATIONS

CHO-SHIELD® 608 Silver-Filled Polyester Coating for EMI Shielding, Data Sheet, Oct. 2011; as posted on Central Coating Co. Inc. website, http://www.centralcoating.com/PDF/CHO-SHIELD_608_1.pdf; accessed Jun. 30, 2016.*

(Continued)

*Primary Examiner* — Tien Q Dinh
*Assistant Examiner* — Alexander V. Giczy
(74) *Attorney, Agent, or Firm* — Pearne & Gordon LLP

(57) ABSTRACT

An aircraft window includes: a window body including window panels, and an electromagnetic shield layer laminated on the window panels; a window frame that is made of a conductive material, and that surrounds the window body; a rubber-based gasket provided with conductivity, the gasket being at least partially held between the window body and the window frame; and a conductive layer that is located between the window body and the gasket, and that brings the electromagnetic shield layer and the gasket into conduction with each other. The window frame includes a holding section that holds the window body. At least a part of the conductive layer extends to a portion of the window body facing an extending part of the holding section. Moreover, the conductive layer extends about an entire perimeter of the (Continued)

window body, and extends only partially along an interface between the window body and interposition member.

14 Claims, 10 Drawing Sheets

(51) Int. Cl.
  *H05K 9/00* (2006.01)
  *E06B 3/62* (2006.01)
  *B64D 45/02* (2006.01)

(52) U.S. Cl.
  CPC .......... *H05K 9/0005* (2013.01); *B64C 1/1476* (2013.01); *B64C 1/1484* (2013.01); *E06B 2003/6258* (2013.01)

(58) Field of Classification Search
  CPC ...... E06B 2003/6258; E06B 3/62; E06B 5/18; E06B 1/34; E06B 1/342; E06B 3/30; E06B 1/36; E06B 3/54; E06B 3/549; E06B 1/56; E06B 1/60; E06B 1/6015; E06B 2001/628; B64D 45/02
  USPC ............................ 52/204.53, 204.54, 204.55
  See application file for complete search history.

(56) References Cited

U.S. PATENT DOCUMENTS

| | | | | |
|---|---|---|---|---|
| 4,758,686 A * | 7/1988 | Takahashi | ................ | H05K 9/00 174/381 |
| 4,793,108 A * | 12/1988 | Bain | ..................... | B64C 1/1492 52/208 |
| 5,139,850 A * | 8/1992 | Clarke | .................... | C03C 17/36 174/389 |
| 5,968,600 A * | 10/1999 | DiLeo | ..................... | C09D 5/24 427/180 |
| 7,749,603 B2 * | 7/2010 | Graham | ............... | H05K 9/0067 427/331 |
| 8,717,734 B1 * | 5/2014 | Johnston | ............... | B64C 1/1492 361/218 |
| 9,415,854 B2 * | 8/2016 | Yokoi | .................... | B64C 1/1492 |
| 2002/0135881 A1 * | 9/2002 | Rukavina | .............. | B64C 1/1484 359/609 |
| 2003/0049462 A1 * | 3/2003 | Oguri | .................... | B64C 1/1492 428/429 |
| 2003/0087048 A1 * | 5/2003 | Chaussade | ............ | B64C 1/1492 428/34 |
| 2005/0039936 A1 * | 2/2005 | Hikita | .................... | B64C 1/1492 174/389 |
| 2007/0137117 A1 * | 6/2007 | Carlson | ................. | B64C 1/1492 52/204.1 |
| 2008/0308677 A1 * | 12/2008 | Kirchoff | ............... | B64C 1/1492 244/129.3 |
| 2013/0062468 A1 | 3/2013 | Yokoi | | |
| 2014/0319276 A1 * | 10/2014 | Yokoi | .................... | B64D 45/00 244/129.3 |

FOREIGN PATENT DOCUMENTS

| | | | |
|---|---|---|---|
| JP | 5060647 B1 | 10/2012 | |
| JP | 2013-060136 A | 4/2013 | |
| WO | WO 03071846 A1 * | 8/2003 | ........... H05K 9/0015 |

OTHER PUBLICATIONS

Wikipedia, Electrical resistivity and conductivity, https://en.wikipedia.org/wiki/Electrical_resistivity_and_conductivity, accessed Dec. 18, 2016.*
NPL—PELCO® High Performance Silver Paste, 50g, Product No. 16047; https://www.tedpella.com/technote_html/16047-TN-V1-06232009.pdf, Jun. 23, 2009. Archived by Internet Archive on Jan. 1, 2011, https://web.archive.org/web/*/https://www.tedpella.com/technote_html/16047-TN-V1-06232009.pdf; accessed Dec. 18, 2016.*
NPL—Ted Pella, Inc., "Conductive Adhesives Tabs, Tapes and Sheets", https://www.tedpella.com/semmisc_html/semadhes.htm. Archived by Internet Archive on Jan. 2, 2012, http://web.archive.org/web/20120102012438/http://www.tedpella.com/SEMmisc_html/SEMadhes.htm, accessed Jan. 11, 2017.*
Office Action issued in Patent Application No. JP 2013-179867 dated Feb. 28, 2017.

* cited by examiner

AIRCRAFT WINDOW ASSEMBLY INCLUDING AN ELECTROMAGNETIC SHIELD, A CLOSING MEMBER INCLUDING AN ELECTROMAGNETIC SHIELDING PROPERTY, AND AN AIRCRAFT INCLUDING AN IMPROVED ELECTROMAGNETIC SHIELD

BACKGROUND OF THE INVENTION

Field of the Invention

The present invention relates to an aircraft window having an electromagnetic shielding function, and a closing member for an opening portion having an electromagnetic shielding function.

Description of the Related Art

During a cruising flight, a landing or a takeoff, an aircraft is required to be able to fly safely without occurrence of malfunctions or unforeseen behaviors (up-set) to the aircraft in high intensity radiated fields (HIRF), which represent electromagnetic environments from radios, televisions, radars, transmitters, and other sources. For this reason, it is necessary to take HIRF protection measures as required in (14CFR) Sections 23.1308, 25.1317, 27.1317, and 29.1317, High-intensity Radiated Fields (HIRF) protection, which stipulate Regulations (airworthiness requirements) of FAA (Federal Aviation Administration).

Recently, the importance of the protection of electric/electronic systems of aircraft has been significantly increasing for the following reasons:
1) a greater dependence on electric/electronic systems that execute functions required for continued safe flight and landing of the aircraft;
2) a decrease in electromagnetic shielding by certain types of composite materials (fiber reinforced resins) used for designing the aircraft;
3) an increase in the susceptibility (sensitivity) of the electric/electronic systems to HIRF along with the increase in operating rates of data buses or processors, the higher densities of ICs (Integrated Circuits) and cards, and the higher sensitivity of electronics;
4) an expansion of a usage frequency particularly to a high-frequency band of 1 GHz or higher;
5) an increase in the severity of HIRF environments along with increases in the number of RF transmitters and electric power; and
6) an adverse effect on some aircrafts during exposure to HIRF.

Meanwhile, inside an aircraft, radio waves or electromagnetic waves (hereinafter, both as "electromagnetic waves") from various electronics such as mobile telephones, game machines, and notebook computers, and PEDs (Personal Electro Devices) such as active-type RFID (Radio Frequency Identification) tags attached to air cargos may have adverse effects on, for example, communications with airport control towers, and communications or controls of navigation for a flight along a predetermined route. Thus, as is well known, passengers are asked to refrain from using various electronics inside the aircraft.

Electromagnetic waves invade an airframe of the aircraft, e.g., a cabin (a seat space), a cockpit (a flight deck), and an avionics bay through a window provided in an opening portion formed in the airframe.

To prevent the invasion of the electromagnetic waves, an electromagnetic shield film is held between a plurality of window panels constituting the window (e.g., see JP 2003-523911A (Translation of PCT Application)).

As shown in FIG. 10, the aircraft window generally includes a window body 21, a window frame 30 that surrounds an outer peripheral portion of the window body 21, and a fixing member, such as a clamp 28, that fixes the window body 21 to the airframe via the window frame 30. The window body 21 has a structure in which window panels 22 and 23, and an electromagnetic shield layer 25 are laminated.

A gasket 50 (an interposition member) for ensuring airtightness is held between the window body 21 and the window frame 30.

A rubber-based material, such as EPDM rubber (ethylene-propylene-diene rubber) and silicone rubber, used for a typical gasket is a non-conductive material, and thus has no electromagnetic shielding effect. Therefore, the non-conductive gasket functions as if it were a slot through which electromagnetic waves pass. Electromagnetic waves in a band of high frequencies whose ½ wavelength is sufficiently smaller than the opening width of the slot invade the airframe through the slot between the window body 21 and the window frame 30 without being attenuated.

For this reason, a method of forming a gasket by a material provided with conductivity by mixing a filler made of metal, carbon or the like, into a rubber-based material has been proposed. The applicant of the present invention also filed a patent application regarding the gasket 50 having conductivity, and the patent application was granted (Japanese Patent No. 5060647, which corresponds to U.S. Pat. No. 8,998,140).

In Japanese Patent No. 5060647, and accordingly U.S. Pat. No. 8,998,140, conductive paint 43 is applied to outermost peripheral portions of the window panels 22 and 23, and the outer periphery of the electromagnetic shield layer 25 exposed from between the window panels 22 and 23 is brought into conduction with the gasket 50 through a planar interface by the conductive paint 43 (see FIG. 10). The electromagnetic shield layer 25 is grounded (bonded) to the airframe through the gasket 50, the fixing member such as the clamp 28, and the window frame 30.

Airtightness required for the window is ensured by the gasket being compressed and deformed between the window body and the window frame.

However, when the amount of the conductive filler mixed into the rubber-based material of the gasket is increased so as to increase the conductivity of the gasket and thereby obtain a sufficient electromagnetic shielding effect, the gasket loses flexibility (elasticity) required for securing the airtightness.

Therefore, at present, there is no choice but to keep the lower limit of the volume resistivity of the conductive gasket to, for example, 5 Ωcm. It is difficult for the conductive gasket to sufficiently attenuate electromagnetic waves.

For example, an electromagnetic wave entering the window panel 22 at an angle indicated by arrow L1 in FIG. 10 is reflected by the electromagnetic shield layer 25 to pass through the gasket 50, and then reflected by the window frame 30 to pass through the gasket 50 again. If the attenuation effect from an absorption loss by the gasket 50 is small, the electromagnetic wave is not sufficiently attenuated, and enters the airframe.

An electromagnetic wave traveling along arrow L2 at an incident angle shallower than that indicated by L1 toward a corner portion C between an end surface of the window panel 22, to which the conductive paint 43 is applied, and an inclined surface thereof also invades the airframe if the electromagnetic wave is not sufficiently attenuated when passing through the gasket 50.

In view of the problems as described above, an object of the present invention is to provide an aircraft window and a closing member provided in an opening portion similarly to the aircraft window, which enable to ensure sufficient electromagnetic shielding performance even if a gasket (an interposition member) cannot be provided with conductivity required for sufficiently attenuating electromagnetic waves, or even if the interposition member has no conductivity.

SUMMARY OF THE INVENTION

An aircraft window according to a first aspect of the present invention is a window provided in an airframe of an aircraft, including: a window body including a window panel having light transmissibility, and an electromagnetic shield layer laminated on the window panel; a window frame that is made of a conductive material, and that surrounds the window body; an interposition member that is formed by using a rubber-based material and also provided with conductivity, the interposition member being at least partially held between the window body and the window frame; and a conductive layer that is located between the window body and the interposition member, and that brings the electromagnetic shield layer and the interposition member into conduction with each other. The window frame includes a holding section that holds the window body via the interposition member from an airframe outer side.

In the present invention, at least a part of the conductive layer extends to a portion of the window body facing the holding section.

The present invention includes a waveguide structure in which the holding section of the window frame and the conductive layer face each other with the interposition member therebetween. Accordingly, an electromagnetic wave is multiply reflected between the holding section of the window frame and the conductive layer. The electromagnetic wave can be thereby sufficiently attenuated by a reflection loss, and an absorption loss through a path where the electromagnetic wave is reflected.

Since an electromagnetic wave entering the window panel is also multiply reflected by the electromagnetic shield layer and the conductive layer, the electromagnetic wave can be sufficiently attenuated.

In the aircraft window of the present invention, the holding section preferably includes a first inclined surface inclined with respect to a thickness direction of the window body, and also the window body preferably includes a second inclined surface extending along the first inclined surface of the holding section.

The entire length of the waveguide structure is extended by these inclined surfaces. Thus, the number of reflections in the waveguide structure is increased, so that the reflection loss is increased, and the absorption loss is also accumulatively increased.

The conductive layer of the present invention may be formed by applying conductive paint to the window body.

The window body of the present invention may include two window panels bonded to each other via the electromagnetic shield layer.

Alternatively, the window body of the present invention may include two window panels arranged via an air layer, and the electromagnetic shield layer may be laminated on a surface on the air layer side of the window panel that is arranged on the airframe outer side. That is, the window body may include an air layer therein, and the electromagnetic shield layer may be provided so as to face the air layer.

An aircraft window according to a second aspect of the present invention is a window provided in an airframe of an aircraft, including: a window body including a window panel having light transmissibility, and an electromagnetic shield layer laminated on the window panel; a window frame that is made of a conductive material, and that surrounds the window body; an interposition member that is formed by using a rubber-based material, the interposition member being at least partially held between the window body and the window frame; and a first conductive layer that is that is located between an end surface of the window body and the interposition member, and that is in conduction with the electromagnetic shield layer. The window frame includes a holding section that holds the window body via the interposition member from an airframe outer side.

In the present invention, a second conductive layer that crosses from the window body to the holding section to come into conduction with the holding section and the first conductive layer is provided.

The second conductive layer crosses in a direction connecting the window body and the holding section.

In accordance with the present invention, since an electromagnetic wave entering the window panel is multiply reflected among the electromagnetic shield layer, the first conductive layer, the second conductive layer, and the holding section, the electromagnetic wave can be sufficiently attenuated.

In the first and second aspects of the present invention, it is preferable to further include a third conductive layer that covers a region between the window body and the holding section from the airframe outer side.

Accordingly, an electromagnetic wave that is to enter the airframe via the interposition member from between the window panel and the holding section of the window frame can be attenuated by reflection and absorption in the third conductive layer. Electromagnetic shielding performance can be thereby improved.

The present invention can be applied to a wide variety of members for closing an opening portion as well as an aircraft window.

A closing member for closing an opening portion formed in an article according to the present invention includes: a closing member body including a closing panel, and an electromagnetic shield layer laminated on the closing panel; a frame that is made of a conductive material, and that surrounds the closing member body; an interposition member that is formed by using a rubber-based material and also provided with conductivity, the interposition member being at least partially held between the closing member body and the frame; and a conductive layer that is located between the closing member body and the interposition member, and that brings the electromagnetic shield layer and the interposition member into conduction with each other.

The frame includes a holding section that holds the closing member body via the interposition member from a side facing the electromagnetic shield layer.

In the present invention, at least a part of the conductive layer extends to a portion of the closing member body facing the holding section.

A closing member for closing an opening portion formed in an article according to another aspect of the present invention includes: a closing member body including a closing panel, and an electromagnetic shield layer laminated on the closing panel; a frame that is made of a conductive material, and that surrounds the closing member body; an interposition member that is formed by using a rubber-based material, the interposition member being at least partially held between the closing member body and the frame; and a first conductive layer that is located between an end surface of the closing member body and the interposition member, and that is in conduction with the electromagnetic shield layer.

The frame includes a holding section that holds the closing member body via the interposition member from a side facing the electromagnetic shield layer.

In the present invention, a second conductive layer that crosses from the closing member body to the holding section to come into conduction with the holding section and first conductive layer is provided.

The present invention can ensure sufficient electromagnetic shielding performance even if the interposition member cannot be provided with conductivity required for sufficiently attenuating electromagnetic waves, or even if the interposition member has no conductivity.

BRIEF DESCRIPTION OF THE DRAWINGS

FIG. 5A shows the data of a conventional example shown in FIG. 10; and FIG. 5B shows the data of the first embodiment;

FIG. 6A shows the data of the conventional example shown in FIG. 10; and FIG. 6B shows the data of the first embodiment;

DETAILED DESCRIPTION OF THE PREFERRED EMBODIMENTS

In the following, embodiments of the present invention are described with reference to the accompanying drawings.

First Embodiment

Figure 1:
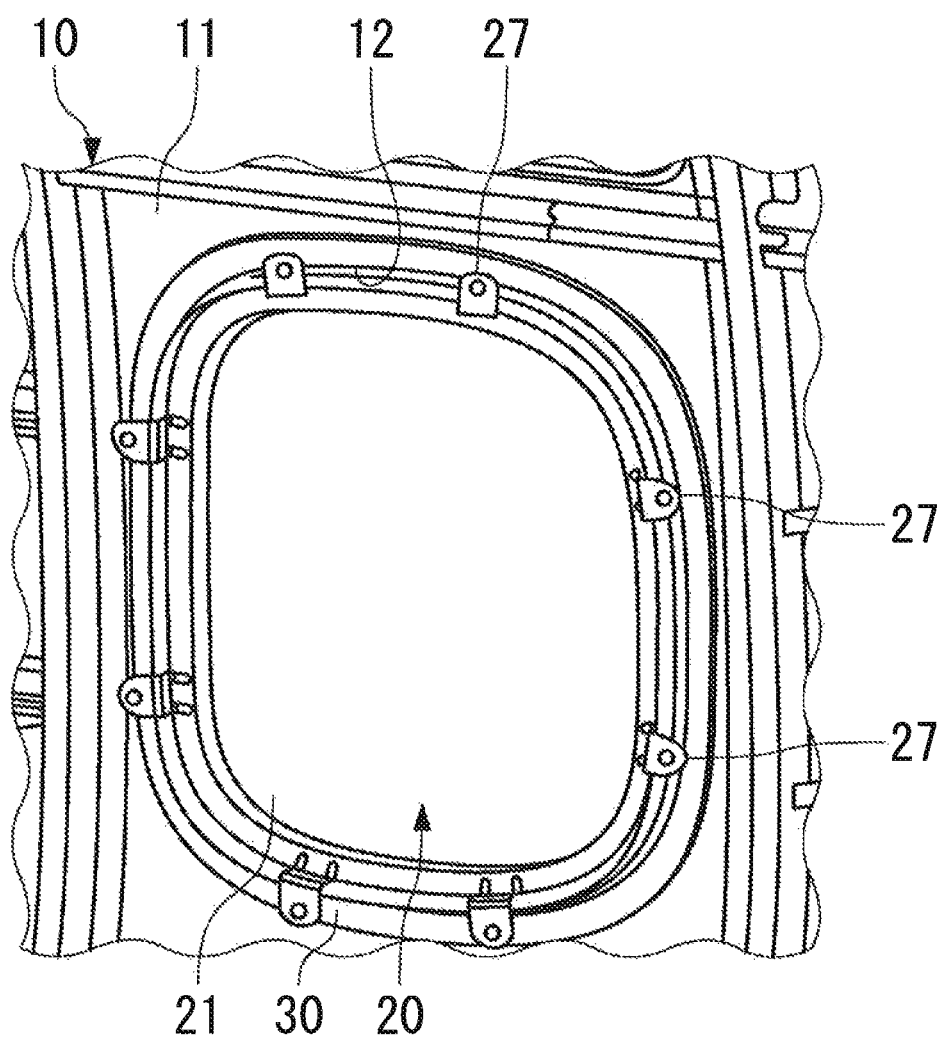
FIG. 1 is a perspective view illustrating an aircraft window according to a first embodiment.

FIG. 1 shows a window 20 that is provided in a cabin of an aircraft.

The window 20 is provided in an opening portion 12 that is formed in a skin 11 constituting an airframe 10 of the aircraft. The window 20 includes a window body 21 having light transmissibility, and a window frame 30 that surrounds the window body 21. The window body 21 is fixed to the skin 11 via the window frame 30 by a fixing members 27 arranged at a plurality of positions along the peripheral edge of the opening portion 12.

Figure 2:
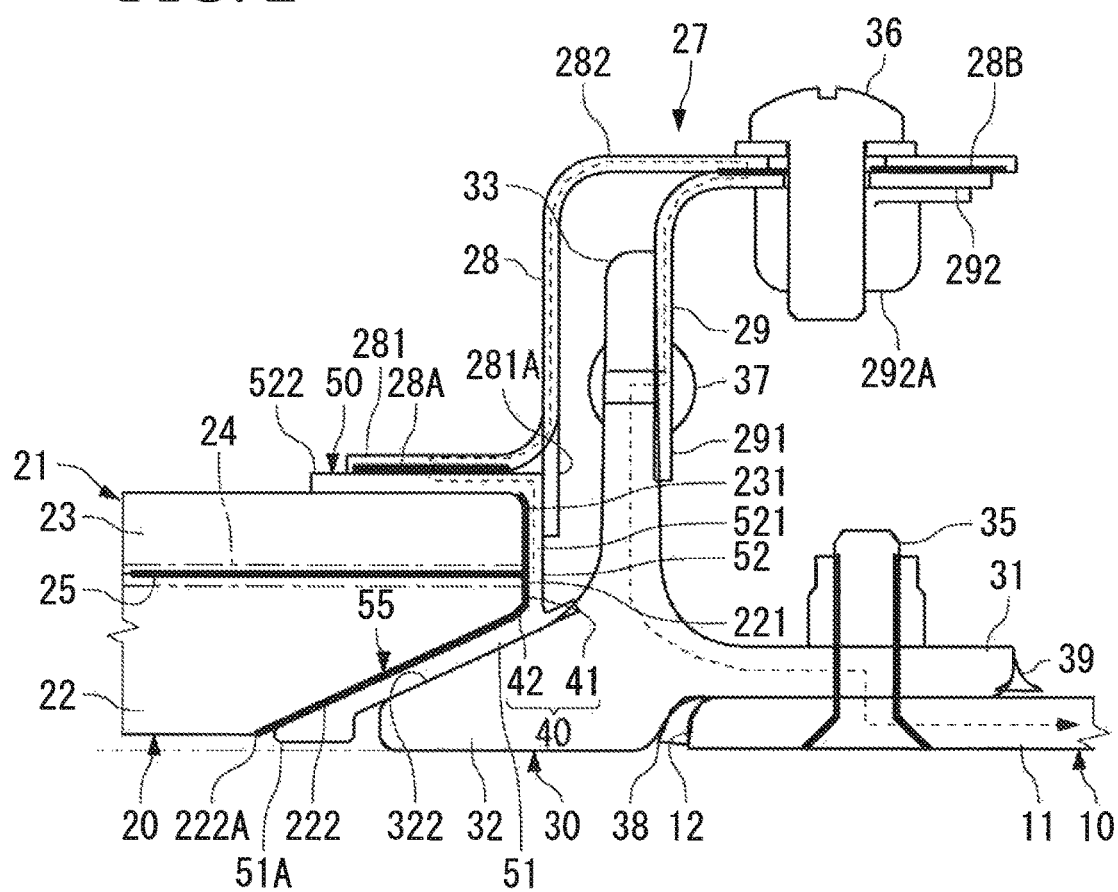
FIG. 2 is a cross-sectional view of the aircraft window according to the first embodiment.

As shown in FIG. 2, the window body 21 includes two window panels 22 and 23, and an electromagnetic shield mesh (an electromagnetic shield layer) 25 that is interposed between the window panels 22 and 23. The electromagnetic shield layer 25 is formed into a plane size substantially equal to that of the window panels 22 and 23.

The window body 21 is a laminate including the window panels 22 and 23 and the electromagnetic shield layer 25.

The window panels 22 and 23 can be made of a resin material such as acrylic or polycarbonate. For example, a stretched acrylic member, the strength of which is increased by stretching a member made of acrylic, is used for the window panels 22 and 23 of the present embodiment.

The electromagnetic shield layer 25 is formed in a mesh pattern by plating a woven fiber base material. The electromagnetic shield layer 25 is called a conductive mesh. The fiber base material can be made of a resin material such as polyester. A metal material such as copper and nickel can be used for plating. The electromagnetic shield layer 25 is held between one surface of the window panel 22 and one surface of the window panel 23.

Micro pores are present between fibers of the fiber base material of the electromagnetic shield layer 25. The electromagnetic shield layer 25 shields electromagnetic waves in a band of low frequencies whose half-wavelength is larger than the pore size.

Instead of the conductive mesh as described above, a thin film made of a metal material such as gold and silver, or ITO (Indium Tin Oxide), a printed mesh formed by printing, in a mesh pattern, an ink containing a conductive filler on a base material made of a transparent resin material, or an expand metal obtained by punching a metal plate may be also used.

As long as the electromagnetic shield layer 25 laminated on the window panels 22 and 23 has conductivity and secures the light transmissibility of the window body 21, any configuration may be employed.

The window panel 22 is arranged on the outer side of the airframe 10 (the airframe outer side), and the window panel 23 is arranged on the inner side of the airframe 10 (the airframe inner side).

Surfaces on the airframe inner side and the airframe outer side of the window panel 23 are connected by a side surface 231 perpendicular to the surfaces.

On the other hand, surfaces on the airframe inner side and the airframe outer side of the window panel 22 are connected by a side surface 221 that is arranged substantially flush with the side surface 231 of the window panel 23, and an inclined side surface 222 that is inclined with respect to a thickness direction of the window panel 23. The entire periphery of a side surface (an end surface) of the window panel 22 is composed of the side surface 221 and the inclined side surface 222.

The inclined side surface 222 is inclined such that an end portion 222A on the airframe outer side is located on the inner peripheral side of the window panel 22 with respect to an end portion (reference numeral is omitted) on the airframe inner side.

The window panels 22 and 23 are bonded to each other with a resin film 24 of polyurethane or the like placed on one or both of the surfaces of the electromagnetic shield layer 25.

The outer periphery of the electromagnetic shield layer 25 is exposed from a joint between the window panels 22 and 23, and brought into conductive contact with a conductive layer 40 provided on the side surfaces of the window panels 22 and 23.

The conductive layer 40 is formed by applying and drying a paint provided with conductivity by containing conductive particles of metal, carbon or the like. The conductive layer 40 is provided over the entire peripheries of the window panels 22 and 23.

More specifically, the conductive layer 40 is continuous over the side surface 231 of the window panel 23, and the side surface 221 and the inclined side surface 222 of the window panel 22, and provided over the entire thickness or substantially the entire thickness of the window body 21.

The conductive layer 40 is divided into a first section 41 provided on the side surface 231 of the window panel 23 and the side surface 221 of the window panel 22, and a second section 42 provided on the inclined side surface 222 of the window panel 22.

Various conductive paints may be used as the conductive layer 40 in consideration of electrical resistivity, affinity to the material of the window panels 22 and 23, workability, color, cost, or the like. For example, a paste or liquid conductive paint may be used.

A water-soluble paint in which copper particles are dispersed (a water-soluble copper paint), or a water-soluble paint in which nickel particles are dispersed (a water-soluble nickel paint) is preferably used as the conductive layer 40. The water-soluble paint has higher safety and better workability than a paint containing a volatile organic solvent.

As an example of the water-soluble copper paint, "599-Z1619", which is a product of SPRAYLAT Corporation, may be employed. In the case in which the product is used, the conductive layer 40 has a thickness of, for example, 2 mil (about 0.05 mm). At this time, the conductive layer 40 has a surface resistivity of, for example, 0.015 Ω/sq.

As an example of the water-soluble nickel paint, "WB-120", which is a product of Randolph Products Co., may be employed. In the case in which the product is used, the conductive layer 40 has a thickness of, for example, 2 mil (about 0.05 mm). At this time, the conductive layer 40 has a surface resistivity of, for example, 0.5 Ω/sq.

Since the conductive layer 40 is provided not only on the side surfaces 221 and 231 of the window panels 22 and 23, but also on the inclined side surface 222 of the window panel 22, the portion provided on the inclined side surface 222 may be seen from inside the cabin. In this case, in order to prevent passengers from being dazzled by scattered sunlight reflected by the conductive layer 40, the conductive layer 40 preferably has a color with a low optical reflectance, e.g., dark gray or black.

In view of anti-dazzle properties, the nickel paint having a dark gray color is preferably used. By using the paint having a color with a low optical reflectance for the conductive layer 40, it is not necessary to additionally apply a paint having a color with a low optical reflectance to the conductive layer 40.

The color of the conductive layer 40 may be also appropriately selected from the perspective of harmony with the color of a cabin interior.

The conductive layer 40 can be formed by any method such as plating, chemical vapor deposition, and physical vapor deposition like sputtering in addition to the application of the conductive paint. The conductive layer 40 may be also composed of a plurality of laminated layers.

The conductive layer 40 contributes to electromagnetic shielding performance of the window 20.

By sealing a gap between the window panels 22 and 23, the conductive layer 40 can also prevent moisture and water from entering between the window panels 22 and 23. Accordingly, hydrolysis of polyurethane used for the resin film 24 can be prevented.

The window frame 30 is made of a conductive material such as metal like aluminum alloy, and carbon fiber reinforced plastic (CFRP) containing carbon fiber.

The window frame 30 includes an abutment section 31 that is abutted against the inner side of the skin 11, a holding section 32 that is continuous to the inner side of the opening portion 12 of the skin 11 from the abutment section 31 so as to hold the window body 21, and a mounting section 33 that is erected to the airframe inner side from between the abutment section 31 and the holding section 32, and to which the fixing member 27 is mounted.

The abutment section 31 is coupled to the skin 11 by a fastener 35 that is made of a conductive material. Accordingly, the conductive window frame 30, and the skin 11 made of a conductive material similarly to the window frame 30 are brought into conductive contact with each other along respective opposing surfaces, or via the fastener 35.

Seal members 38 and 39 are provided between the abutment section 31 and the skin 11.

An inclined surface 322 along the inclined side surface 222 of the window panel 22 is formed in the holding section 32. The inclined side surface 222 and the inclined surface 322 are arranged parallel to each other.

When the outside of the airframe is at a negative pressure with respect to a pressure inside the airframe during a flight, the inclined surface 322 of the window frame 30 surely receives and holds the inclined side surface 222 of the window panel 22.

The mounting section 33 is erected at an interval from the side surface of the window body 21 so as to facilitate installment of the fixing member 27 used for assembling the window 20.

One portion of a gasket 50 having conductivity is held between the window frame 30 and the window body 21.

The gasket 50 is provided with conductivity by mixing a conductive filler into a rubber-based material such as silicone rubber and EPDM rubber (ethylene-propylene-diene rubber).

The conductive filler can be made of a conductive material such as Ag, Ag—Cu alloy, Ag—Al alloy, Ni—Cu alloy, Ni—Al alloy, Ag—C alloy, Ni—C alloy, and carbon.

The volume resistivity of the gasket 50 can be adjusted according to the mixture amount of the conductive filler. For example, the volume resistivity is 5 Ωcm to 300 Ωcm.

The gasket 50 includes a sealing section 51 that is held between the inclined side surface 222 of the window panel 22 and the inclined surface 322 of the window frame 30, and a fixing section 52 that extends onto the surface on the airframe inner side of the window panel 23 along the side surface of the window body 21 from the sealing section 51. The entire gasket 50 is thereby formed in a substantially C shape in section. An outer peripheral portion of the window body 21 is inserted into the inner side of the gasket 50.

The sealing section 51 is abutted against the window frame 30, and the fixing section 52 is pressed by the fixing member 27. Accordingly, the gasket 50 is held on both the window frame 30 and the window body 21.

The sealing section 51 comes into close contact with both the inclined side surface 222 and the inclined surface 322, thereby sealing a gap between the window body 21 and the window frame 30. An end portion 51A of the sealing section 51 exposed from between the window body 21 and the window frame 30 is formed thick so as to ensure rigidity.

The fixing section 52 includes a conduction section 521 along the side surface of the window body 21, and a pressing section 522 along the surface on the airframe inner side of the window panel 23.

The conduction section 521 is brought into close contact with the first section 41 of the conductive layer 40 provided on the side surface of the window body 21. The conductive layer 40 and the gasket 50 are thereby brought into conductive contact with each other, so that the electromagnetic shield layer 25 and the gasket 50 are brought into conduction with each other through the conductive layer 40.

An electromagnetic shield structure 55 including the gasket 50 has a structure in which the second section 42 of the conductive layer 40 and the inclined surface 322 of the holding section 32 of the window frame 30 face each other with the sealing section 51 of the gasket 50 therebetween.

The electromagnetic shield structure 55 is continuous over the entire circumferential periphery of the window frame 30.

The electromagnetic shield structure 55 functions as if it were a waveguide for electromagnetic waves, and guides electromagnetic waves entering between the window body 21 and the holding section 32 of the window frame 30. The electromagnetic waves are attenuated while being guided by the electromagnetic shield structure 55.

The fixing member 27 fixes the window body 21 to the skin 11 via the gasket 50 and the window frame 30.

The fixing member 27 includes a crank-shaped clamp 28, and an L-shaped clip 29. The clamp 28 and the clip 29 are both made of a conductive material similarly to the window frame 30.

The clamp 28 has one end section 281 that is overlapped with the pressing section 522 of the gasket 50, and the other end section 282 that is located on the airframe inner side with respect to the mounting section 33 of the window frame 30.

The one end section 281 has a pressing section 281A that presses the conduction section 521 of the gasket 50 toward the side surface of the window body 21.

The clip 29 has one end section 291 that is coupled to the outer peripheral side of the mounting section 33 of the window frame 30 by a rivet 37 made of a conductive material, and the other end section 292 that is coupled to the other end section 282 of the clamp 28 by a screw 36 made of a conductive material. A plate nut 292A, to which the screw 36 is tightened, is provided at the other end section 292 of the clip 29.

The clamp 28 presses the window body 21 toward the window frame 30 via the gasket 50, and the clamp 28 is coupled to the clip 29 fixed to the window frame 30 by the screw 36. Accordingly, the window body 21 is fixed to the skin 11 to which the window frame 30 is fixed.

At this time, the sealing section 51 of the gasket 50 is compressed and elastically deformed between the window frame 30 and the window body 21, and comes into close contact with the inclined side surface 222 of the window panel 22 and the inclined surface 322 of the window frame 30. Accordingly, airtightness between the window body 21 and the window frame 30 is ensured.

The one end section 281 of the clamp 28 is brought into conduction with the pressing section 522 of the gasket 50. The other end section 282 of the clamp 28 and the other end section 292 of the clip 29 are also brought into conduction with each other.

The clamp 28 and the clip 29 constitute one portion of a grounding path for grounding the electromagnetic shield layer 25 to the skin 11.

The grounding path passes through the conductive layer 40, the gasket 50, the clamp 28, the clip 29, and the window frame 30 from the electromagnetic shield layer 25, to reach the skin 11 as indicated by a dashed line in FIG. 2.

To reduce contact resistance between the gasket 50 and the clamp 28, a conductive film 28A is preferably formed on a surface of the clamp 28 facing the gasket 50.

To reduce contact resistance between the clamp 28 and the clip 29, a conductive film 28B is preferably formed on a surface of the clamp 28 facing the clip 29. The conductive film 28B may be formed on one or both of the surface of the clamp 28 facing the clip 29 and a surface of the clip 29 facing the clamp 28.

A chemical conversion coating film may be used as the conductive films 28A and 28B. A chromate film may be employed as an example of the chemical conversion coating film.

Electromagnetic shielding effects obtained by the window 20 described above are described.

Figure 3:
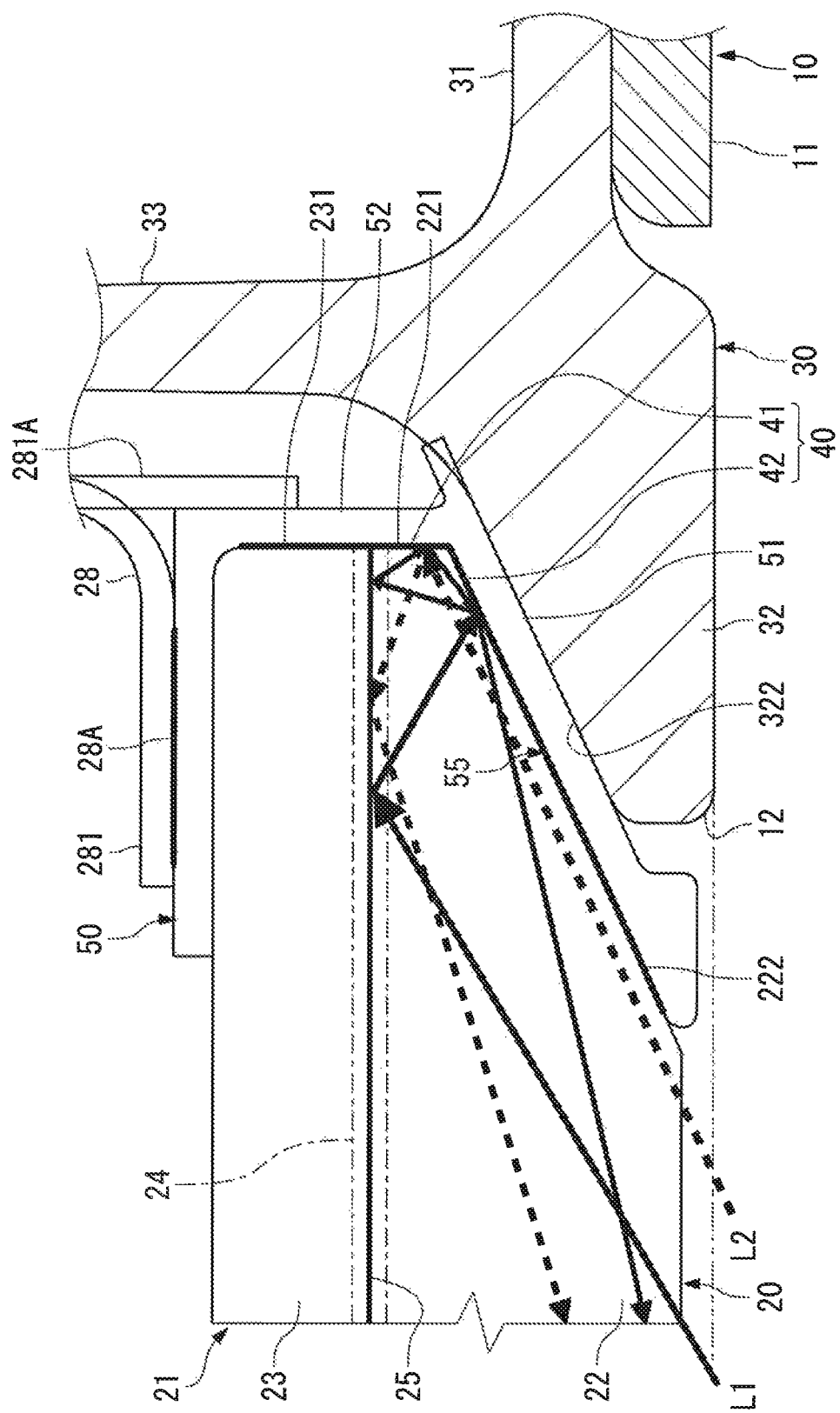
FIG. 3 is a main portion enlarged view of FIG. 2.

First, a first shielding effect by the grounded electromagnetic shield layer 25 and the conductive layer 40 is described with reference to FIG. 3.

As described above, the conductive layer 40 is brought into conductive contact with the outer periphery of the electromagnetic shield layer 25, and the conductive layer 40 extends to the inclined side surface 222 of the window panel 22. The electromagnetic shield layer 25 and the conductive layer 40 provided continuously to each other as described above function as a dead end that encloses electromagnetic waves from three directions of the electromagnetic shield layer 25, the side surface 221 of the window panel 22, and the inclined side surface 222 of the window panel 22.

An electromagnetic wave entering into the window panel 22 along an arrow L1 is reflected by the electromagnetic shield layer 25, and then reflected by the second section 42 of the conductive layer 40. The electromagnetic wave is further reflected by the electromagnetic shield layer 25, and then reflected by the first section 41 of the conductive layer 40. After that, the electromagnetic wave is reflected by the second section 42 to be returned to the outside of the airframe.

An electromagnetic wave entering into the window panel 22 along an arrow L2 at an incident angle shallower than that of L1 is reflected by the first section 41 of the conductive layer 40. After that, the electromagnetic wave is reflected by the electromagnetic shield layer 25 to be returned to the outside of the airframe.

The electromagnetic wave entering into the window panel 22 is partially absorbed when being transmitted through the electromagnetic shield layer 25 and the conductive layer 40.

Every time the electromagnetic wave enters into the electromagnetic shield layer 25 and the conductive layer 40, a reflection loss and an absorption loss occur. Since the losses occur multiply, the electromagnetic wave is largely attenuated.

Figure 4:
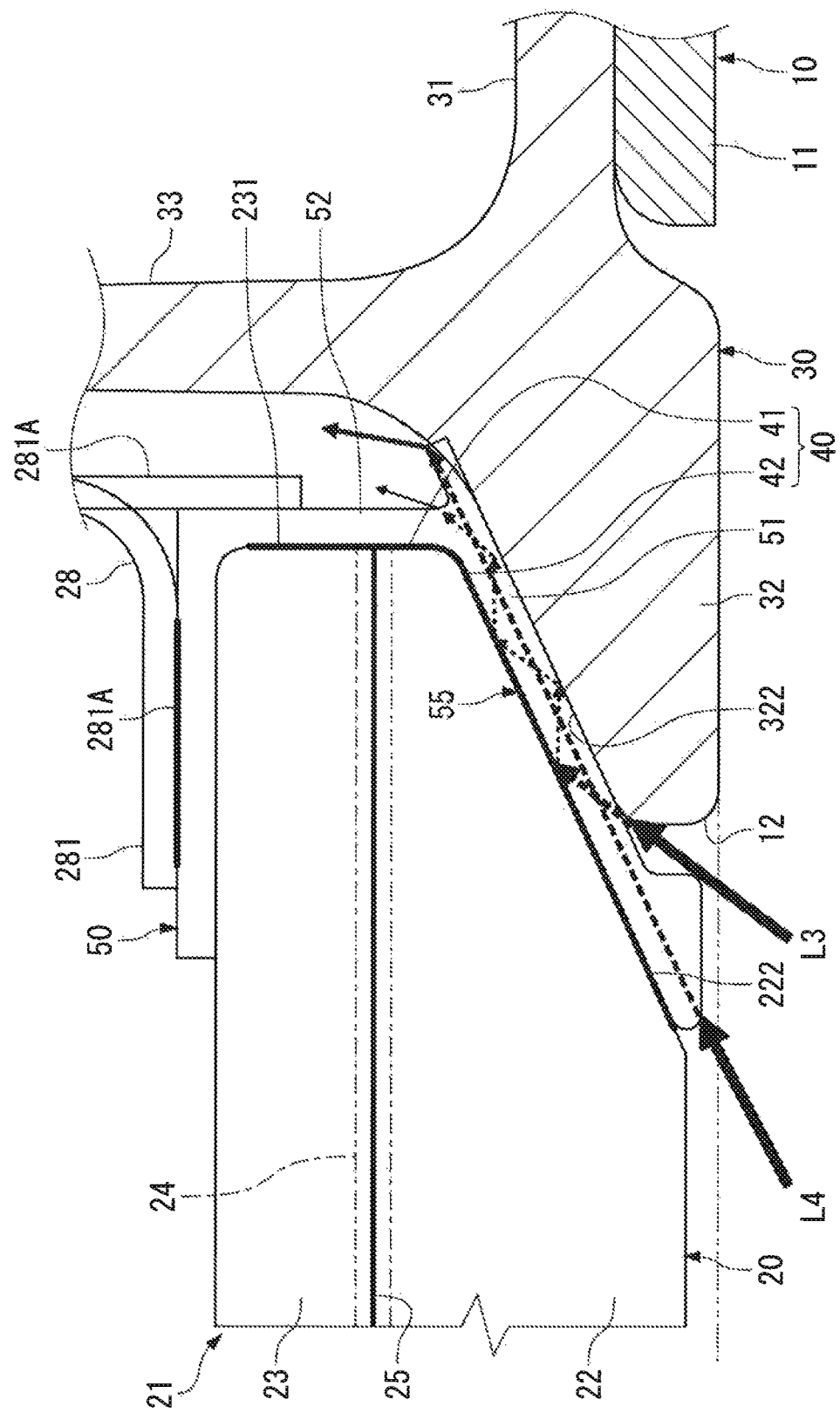
FIG. 4 is a main portion enlarged view of FIG. 2.

Next, a second shielding effect by the electromagnetic shield structure 55 is described with reference to FIG. 4.

To maintain required flexibility of the gasket 50 for ensuring the airtightness, the amount of the conductive filler to be contained in the gasket 50 is limited. Thus, the conductivity of the gasket 50 is lower than that of metal.

Therefore, the attenuation of electromagnetic waves obtained by providing the gasket 50 with conductivity by the conductive filler is, for example, only about 3 dB.

Even if the gasket 50 alone might not sufficiently attenuate electromagnetic waves. However, the electromagnetic shield structure 55 including the gasket 50 can sufficiently attenuate electromagnetic waves as the second shielding effect.

The second section 42 of the conductive layer 40 and the holding section 32 of the window frame 30 facing each other with the gasket 50 therebetween form the waveguide structure for guiding electromagnetic waves.

Accordingly, an electromagnetic wave entering between the window body 21 and the window frame 30 as indicated by an arrow L3 passes through the gasket 50 while being repetitively reflected between the second section 42 and the holding section 32.

Since the electromagnetic wave is reflected, a guiding path, through which the electromagnetic wave travels, becomes longer than the actual length of the waveguide structure (the length of a region where the second section 42 and the holding section 32 face each other). An absorption loss by the gasket 50 is smaller than absorption losses by the conductive layer 40 and the window frame 30. However, if the guiding path is long, the absorption loss is accumulatively increased to a large value through the guiding path. The electromagnetic wave indicated by the arrow L3 is sufficiently attenuated by the absorption loss by the gasket 50 in addition to multiple reflection losses, and the absorption losses by the conductive layer 40 and the window frame 30.

An electromagnetic wave indicated by an arrow L4 having an incident angle shallower than that of L3 travels into the airframe inner side while being guided between the conductive layer 40 and the window frame 30. A path where the electromagnetic wave passes through the gasket 50 has a large length, unlike a path with a small length where electromagnetic waves indicated by arrows L1 and L2 in FIG. 10 cross the gasket 50. Therefore, the electromagnetic wave can be sufficiently attenuated by the absorption loss by the gasket 50.

Sufficient electromagnetic shielding performance can be ensured by the first shielding effect and the second shielding effect described above.

Figure 5A:
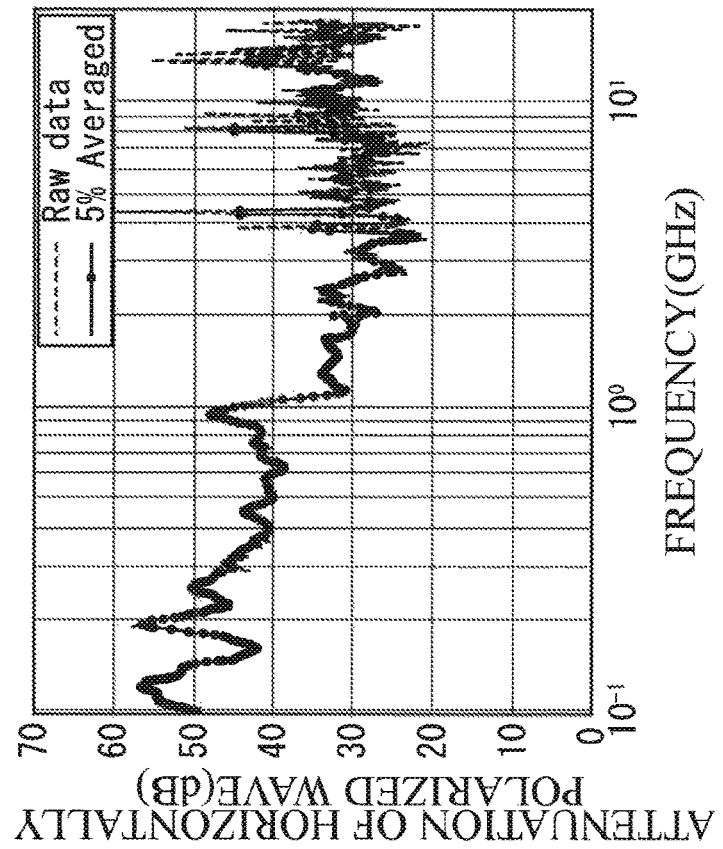
FIGS. 5A and 5B are graphs showing the attenuation effect of a horizontally polarized electromagnetic wave.
Figure 5B:
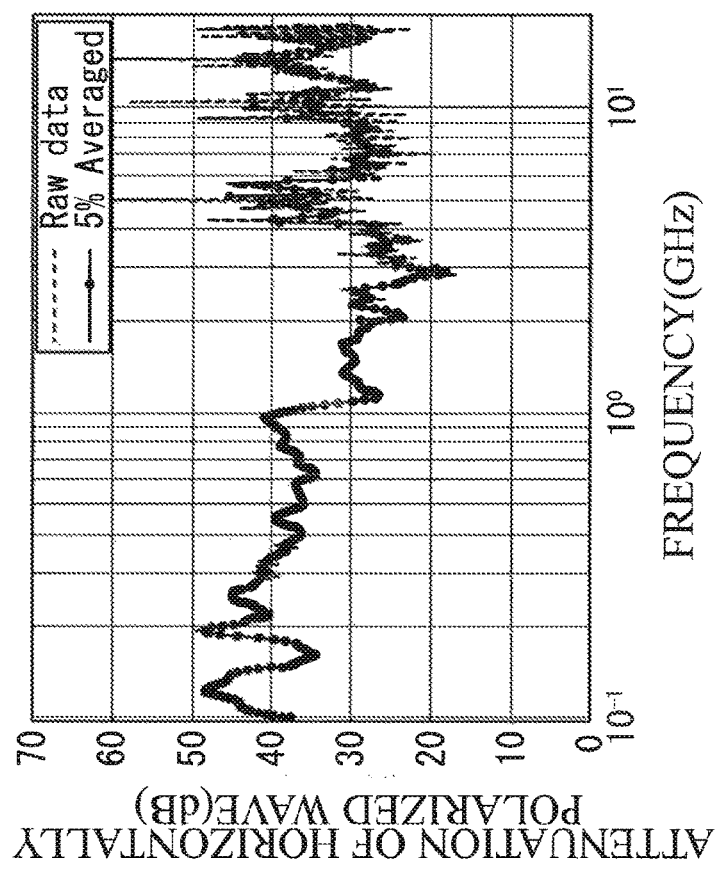
Figure 10:
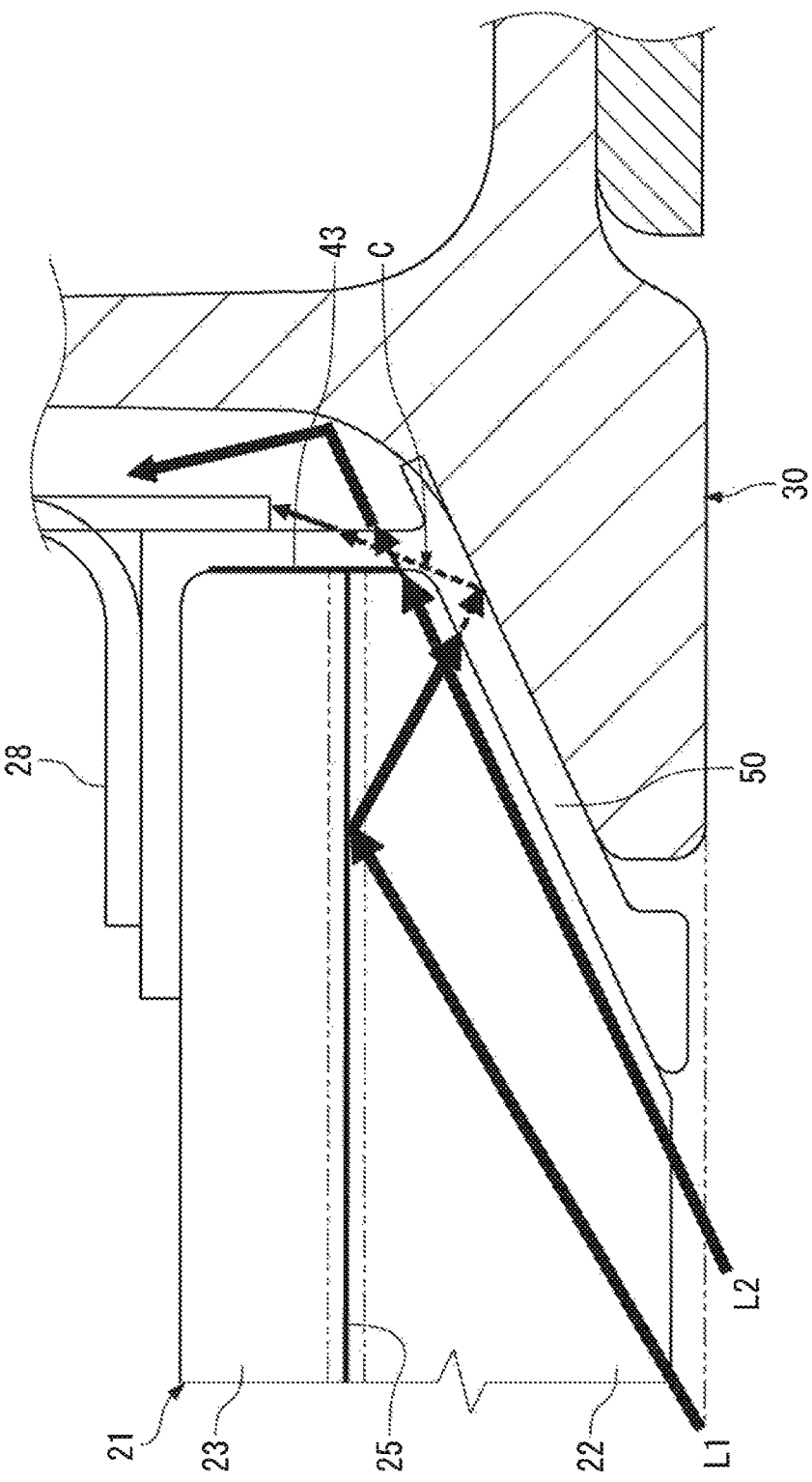
FIG. 10 is a view illustrating the conventional example.

FIG. 5A shows the attenuation effect of a horizontally polarized electromagnetic wave obtained by a conventional example shown in FIG. 10. FIG. 5B shows the attenuation effect of a horizontally polarized electromagnetic wave obtained by the present embodiment.

The bandwidth average of the attenuation is indicated by a solid line, and the ratio of field intensity inside the airframe to that outside the airframe is indicated by a logarithm (20 log).

As is understood from the graphs, in the present embodiment, the attenuation of the horizontally polarized wave can be increased by about 4 to 8 dB as compared to the conventional example over an entire frequency range from 100 MHz to 18 GHz.

Figure 6A:
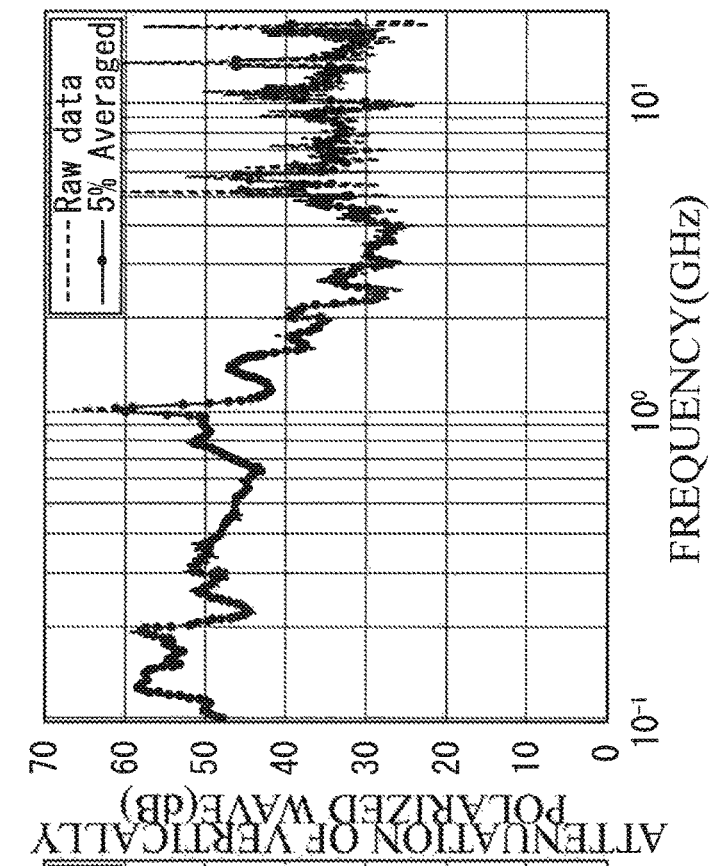
FIGS. 6A and 6B are graphs showing the attenuation effect of a vertically polarized electromagnetic wave.
Figure 6B:
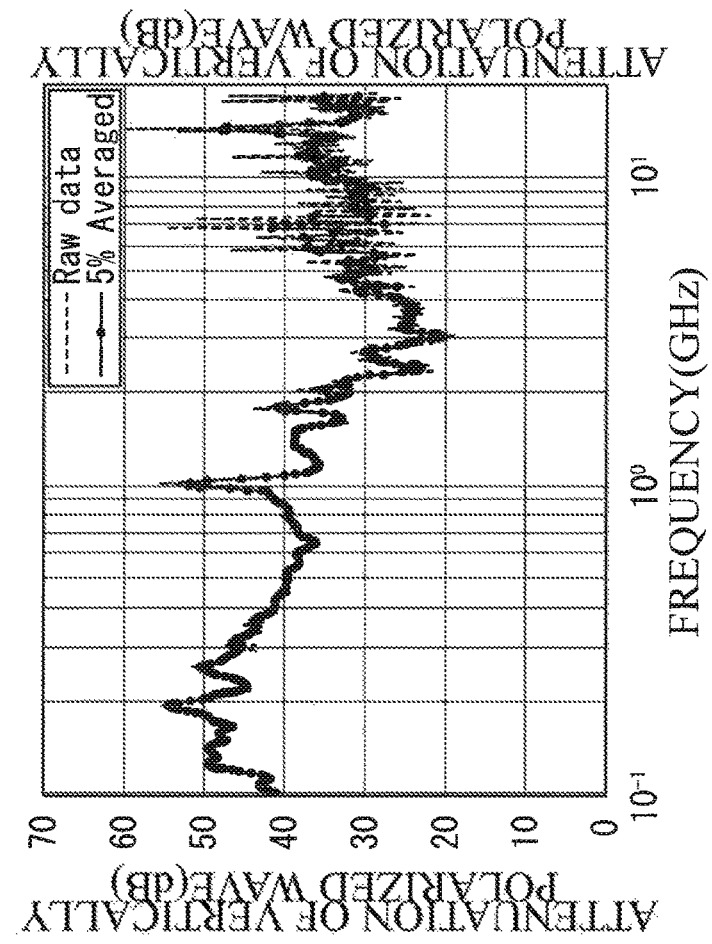

FIGS. 6A and 6B similarly show the attenuation effect of a vertically polarized electromagnetic wave.

As is understood from the graphs, in the present embodiment (FIG. 6B), the attenuation of the vertically polarized wave can be increased by about 5 to 10 dB as compared to the conventional example (FIG. 6A) over an entire frequency range from 100 MHz to 18 GHz.

Modification of the First Embodiment

Figure 7:
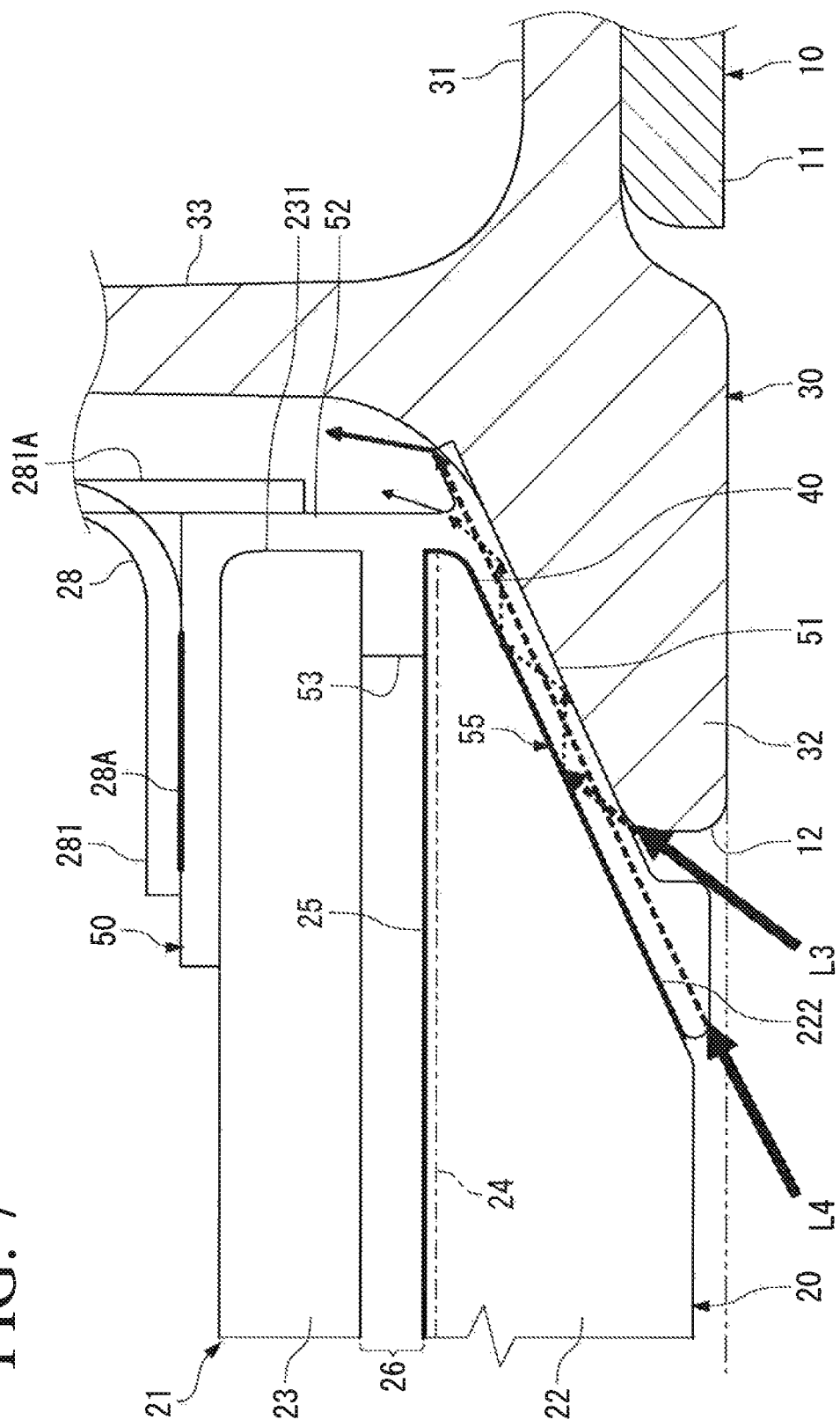
FIG. 7 is a cross-sectional view illustrating an aircraft window according to a modification of the first embodiment.

The first embodiment may be applied to an air gap-type window where an air layer is provided between the window panels 22 and 23 as shown in FIG. 7.

In a configuration shown in FIG. 7, the same components as those of the first embodiment are assigned the same reference numerals.

The window panels 22 and 23 face each other via an air layer 26. A small hole (not shown) for removing air is formed in the window panel 23.

The gasket 50 includes a rib 53 that is arranged between the window panels 22 and 23.

The electromagnetic shield layer 25 is provided on the surface on the airframe inner side of the window panel 22. The outer periphery of the electromagnetic shield layer 25 is brought into conductive contact with the conductive layer 40 provided on the inclined side surface 222 of the window panel 22.

In the present modification, both the first shielding effect and the second shielding effect described above can be also obtained by the electromagnetic shield layer 25 and the conductive layer 40. Accordingly, the electromagnetic shielding performance required for the aircraft window can be ensured.

In the first embodiment, the gasket 50, in which the portion held between the window body 21 and the holding section 32 (the sealing section 51) and the portion along the side surface and the surface on the airframe inner side of the window body 21 (the fixing section 52) are integrally formed, constitutes an interposition member that is held between the window body 21 and the holding section 32 of the window frame 30.

The interposition member does not need to be composed of a single member, and may be composed of a plurality of members. For example, the sealing section 51 and the fixing section 52 may be separately provided, and combined together.

Although the conductive layer 40 is preferably provided continuously over the side surface 231 of the window panel 23 and the side surface 221 and the inclined side surface 222 of the window panel 22 as in the first embodiment, the present invention also allows a configuration in which the conductive layer is intermittently provided via a fine gap. Although the conductive layer is preferably formed integrally, a plurality of sections of the conductive layer may be separately formed.

The conductive layer having the above configuration can also exert better electromagnetic shielding effects than those of a conventional structure as long as the conductive layer extends to a portion of the window body facing the holding section of the window frame.

Second Embodiment

Figure 8:
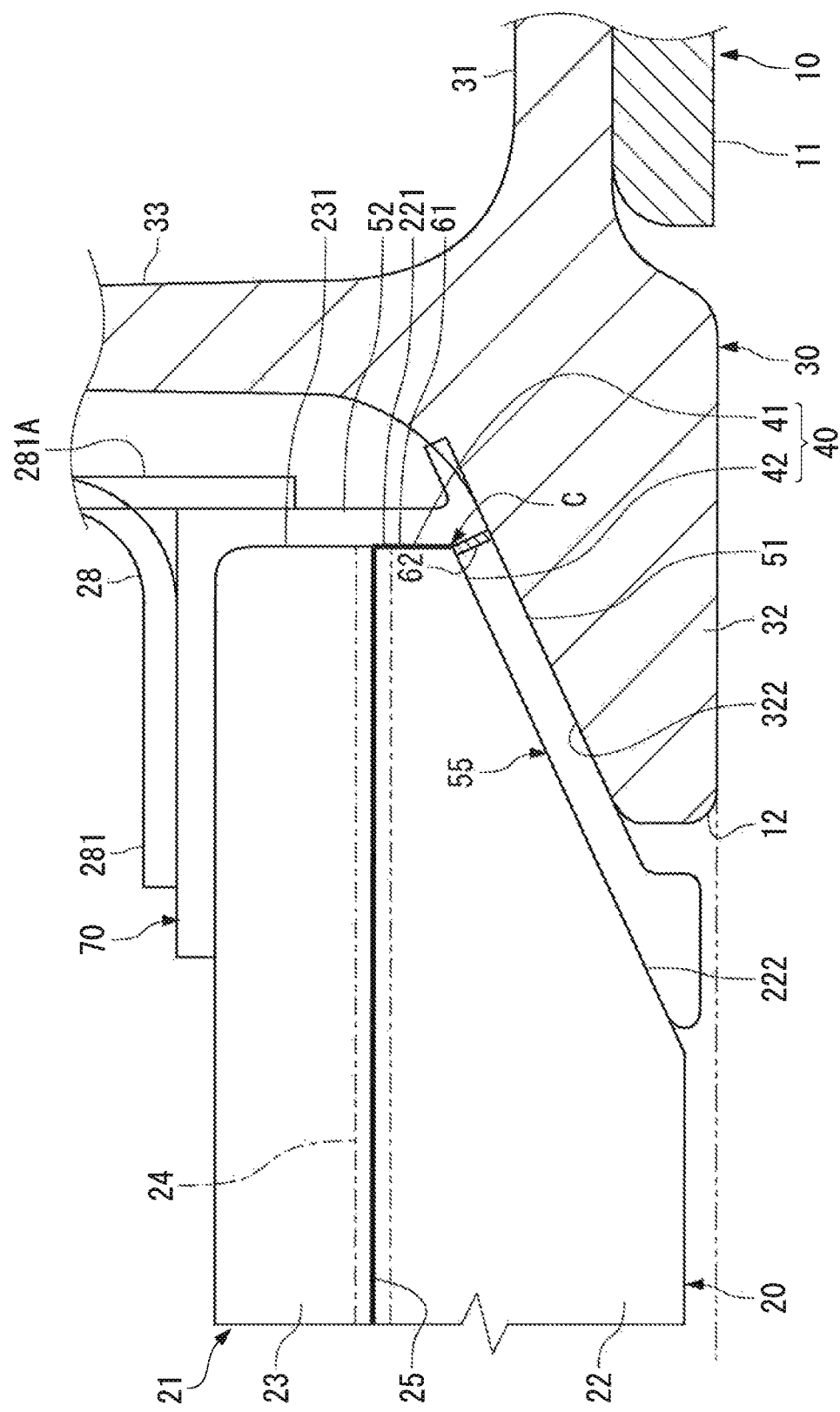
FIG. 8 is a cross-sectional view of an aircraft window according to a second embodiment.

Next, an aircraft window according to a second embodiment of the present invention is described with reference to FIG. 8.

In the second embodiment, differences from the first embodiment are mainly described. The same components as those of the first embodiment are assigned the same reference numerals.

The window of the second embodiment includes a first conductive layer 61 that is formed on the side surface (the end surface) of the window body 21, and a non-conductive gasket 70.

The first conductive layer 61 is formed on the side surface 221 of the window panel 22, and is brought into conduction with the outer periphery of the electromagnetic shield layer 25. The first conductive layer 61 does not extend to the inclined side surface 222 of the window panel 22 facing the holding section 32 of the window frame 30. An end portion on the airframe outer side of the first conductive layer 61 is located at a corner portion C formed by the side surface 221 and the inclined side surface 222 of the window panel 22.

The first conductive layer 61 can be made of a conductive paint similarly to the above conductive layer 40.

The gasket 70 includes the sealing section 51 and the fixing section 52 having the same configuration as that of the gasket 50. The gasket 70 is not provided with conductivity since the gasket 70 is made of a rubber-based material such as silicone rubber and EPDM rubber without mixing a conductive filler therein.

The sealing section 51 has a second conductive layer 62 that is brought into conduction with the end portion on the airframe outer side of the first conductive layer 61 and the holding section 32.

The second conductive layer 62 crosses from the window panel 22 to the holding section 32 in a direction connecting the window panel 22 and the holding section 32 at a position facing the corner portion C formed between the side surface 221 and the inclined side surface 222 of the window panel 22.

The second conductive layer 62 is made of a conductive material such as metal and carbon. The second conductive layer 62 may be configured similarly to the electromagnetic shield layer 25.

The second conductive layer 62 is interposed between a section from the distal end (the airframe outer side) of the sealing section 51 to the corner portion C, and another section in the gasket 70. The second conductive layer 62 can be formed, for example, by insert-molding the gasket 70 by using a metal sheet.

Since the first conductive layer 61 and the window frame 30 are brought into conduction with each other through the second conductive layer 62, a grounding path passing through the first conductive layer 61, the second conductive layer 62, and the window frame 30 from the electromagnetic shield layer 25, and further through the fastener 35 (FIG. 1) from the window frame 30, to reach the airframe 10 is formed.

In the second embodiment, the first conductive layer 61 is brought into conductive contact with the outer periphery of the electromagnetic shield layer 25, the end portion on the airframe outer side of the first conductive layer 61 is brought into conduction with the second conductive layer 62, and the second conductive layer 62 is brought into conduction with the holding section 32 of the window frame 30 as described above. The electromagnetic shield layer 25, the first conductive layer 61, the second conductive layer 62, and the holding section 32 provided continuously to each other as described above function as a dead end that encloses electromagnetic waves from four directions thereof.

Therefore, the first shielding effect is obtained similarly to the first embodiment.

An electromagnetic wave entering into the window panel 22 is appropriately reflected among the electromagnetic shield layer 25, the first conductive layer 61, the second conductive layer 62, and the holding section 32 according to its incident angle, and is finally returned to the outside of the airframe. The same applies to an electromagnetic wave entering into the sealing section 51 of the gasket 70 along the inclined side surface 222.

The electromagnetic wave entering into the window panel 22 is partially absorbed when being transmitted through the electromagnetic shield layer 25, the first conductive layer 61, and the second conductive layer 62.

Every time the electromagnetic wave enters into the electromagnetic shield layer 25, the first conductive layer 61, and the second conductive layer 62, a reflection loss and an absorption loss occur. Since the losses occur multiply, the electromagnetic wave is largely attenuated.

As described above, sufficient electromagnetic shielding performance can be also ensured by the second embodiment.

Modification of the Second Embodiment

Figure 9:
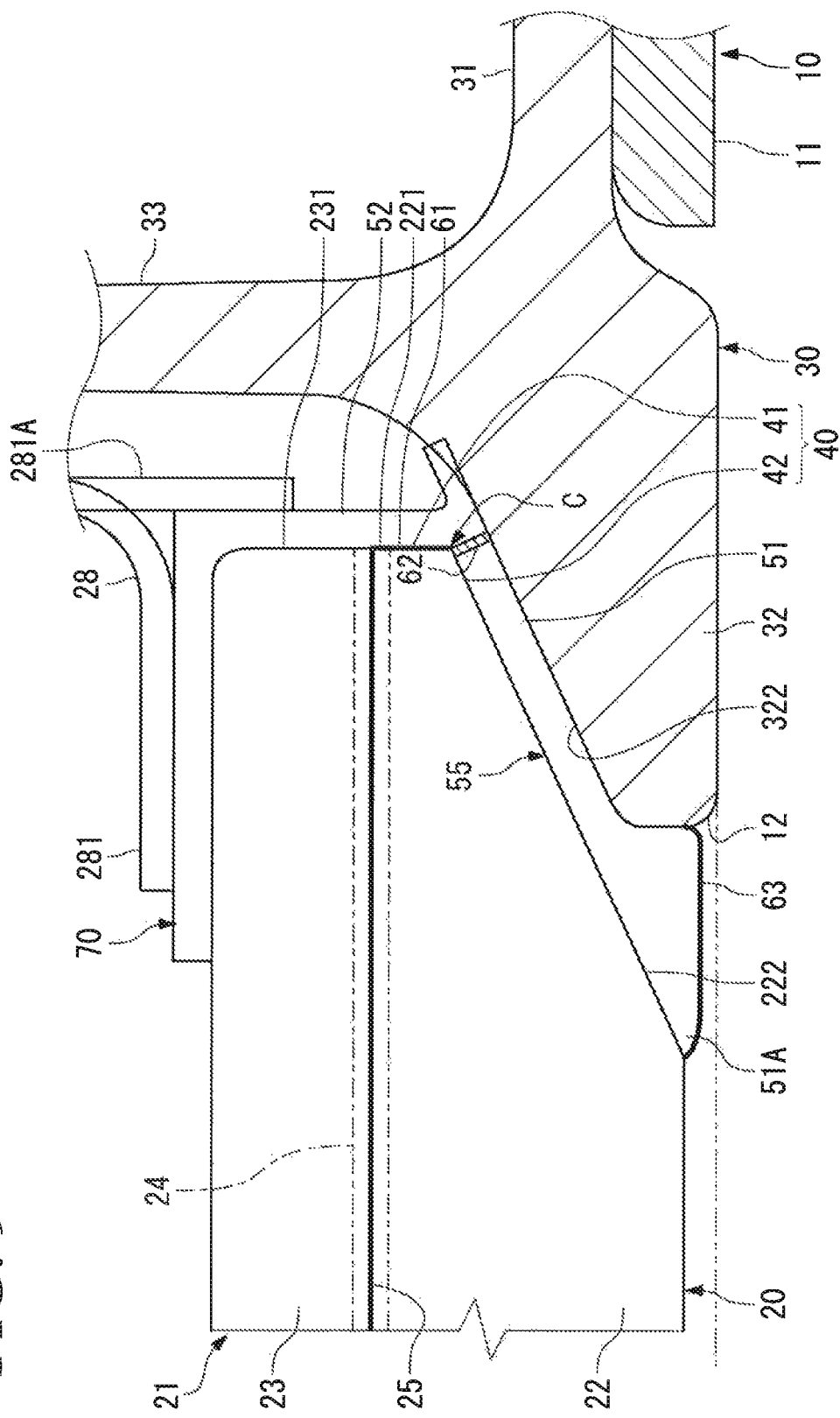
FIG. 9 is a cross-sectional view of an aircraft window according to a modification of the second embodiment.

In the second embodiment, a third conductive layer 63 may be also provided on the end portion 51A on the airframe outer side of the gasket 70 as shown in FIG. 9.

In the present embodiment, the end portion 51A of the gasket 70 preferably closes the gap between the window panel 22 and the holding section 32.

The third conductive layer 63 covers a region between the window panel 22 and the holding section 32 from the airframe outer side.

The third conductive layer 63 is made of a conductive material such as metal and carbon. A conductive paint, or a plate made of a conductive material may be used for the third conductive layer 63. The third conductive layer 63 may be also configured similarly to the electromagnetic shield layer 25.

In the present modification, an electromagnetic wave that is to enter into the sealing section 51 of the gasket 70 can be attenuated by reflection and absorption at the third conductive layer 63, so that the electromagnetic shielding performance can be improved.

The second conductive layer 62 of the second embodiment (FIG. 8) may be also applied to the window 20 of the first embodiment.

The third conductive layer 63 of the modification (FIG. 9) of the second embodiment may be also applied to the window 20 of the first embodiment.

When the second conductive layer 62 is applied to the first embodiment, the electromagnetic wave is reflected and absorbed on the terminating end side (the airframe inner side) of the electromagnetic shield structure 55 that functions similarly to the waveguide. When the third conductive layer 63 is applied to the first embodiment, the electromagnetic wave is reflected and absorbed on the starting end side (the airframe outer side) of the electromagnetic shield structure 55. Accordingly, the electromagnetic shielding performance can be improved.

The gasket 70 in the second embodiment and its modification may be also provided with conductivity by mixing a conductive filler into the rubber-based material. In this case, the electromagnetic wave passing through the gasket 70 can be attenuated by the absorption loss.

The present invention may be applied to a flight deck window as well as the cabin window.

The present invention may be also applied to a window (a door window) provided in a door of the aircraft.

Moreover, the present invention may be applied to the door or an escape hatch of the aircraft.

The present invention is not limited to applications in the aircraft, and may be generally applied to a closing member that closes an opening portion. The closing member includes a closing member body including a closing panel and an electromagnetic shield layer laminated on the closing panel, and a frame that is made of a conductive material and surrounds the closing member body.

Examples of the closing member, to which the present invention can be applied, include a window or a sunroof for automobiles, a monitor of electronics, and a lens protection filter of various cameras.

The constitutions described in the aforementioned embodiments may be also freely selected or changed into other constitutions without departing from the gist of the present invention.

What is claimed is:

1. An aircraft window provided in an airframe of an aircraft, comprising:

a window body including a window panel having light transmissibility, and an electromagnetic shield layer laminated on the window panel;

a window frame that is made of a conductive material, and that surrounds the window body;

an interposition member that is formed by using a rubber-based material combined with a conductive material that provides the interposition member with conductivity, the interposition member being at least partially held between the window body and the window frame; and a conductive layer that is located between the window body and the interposition member, and that brings the electromagnetic shield layer and the interposition member into conduction with each other, wherein the window frame includes a holding section that holds the window body via the interposition member from an airframe outer side, at least a part of the conductive layer extends to a portion of the window body facing an extending part of the holding section, the conductive layer has a surface resistivity of 0.5 Ω/sq or lower, the conductive layer extends about an entire perimeter of the window body, wherein the window body has an inner surface, an outer surface, a side surface immediately adjacent the inner surface, and an outwardly facing surface that connects the side surface and with the outer surface, wherein the interposition member has an inner portion that extends along the inner surface of the window body, a side portion that extends along the side surface of the window body, and an outwardly facing portion that extends along the outwardly facing surface of the window body, the conductive layer extends along an interface between the outwardly facing portion of the interposition member and the outwardly facing surface of the window body, the conductive layer extends along an interface between the side portion of the interposition member and the side surface of the window body, and the conductive layer does not extend along an interface between inner portion of the interposition member and the inner surface of the window body.

2. The aircraft window according to claim 1, wherein the conductive layer is provided on the window body.

3. The aircraft window according to claim 1, wherein the holding section comprises a first inclined surface inclined with respect to a thickness direction of the window body, and the window body comprises a second inclined surface extending along the first inclined surface of the holding section.

4. The aircraft window according to claim 1, wherein the conductive layer is formed by applying conductive paint to the window body.

5. The aircraft window according to claim 1, wherein the window body further includes a second window panel bonded to the window panel via the electromagnetic shield layer.

6. The aircraft window according to claim 1, wherein the interposition member is provided with a volume resistivity of at least 5 Ωcm.

7. The aircraft window according to claim 1, wherein the conductive layer is a water-soluble paint with conductivity.

8. The aircraft window according to claim 1, wherein the conductive layer is a water-soluble paint with conductivity which is applied to the window body.

9. An aircraft comprising the aircraft window according to claim 1.

10. A closing member for closing an opening portion formed in an article, comprising:

a closing member body including a closing panel, and an electromagnetic shield layer laminated on the closing panel;

a frame that is made of a conductive material, and that surrounds the closing member body;

an interposition member that is formed by using a rubber-based material combined with a conductive material that provides the interposition member with conductivity, the interposition member being at least partially held between the closing member body and the frame; and a conductive layer that is located between the closing member body and the interposition member, and that brings the electromagnetic shield layer and the interposition member into conduction with each other, wherein the conductive layer has a surface resistivity of 0.5 Ω/sq or lower, wherein the frame includes a holding section that holds the closing member body via the interposition member from a side facing the electromagnetic shield layer, at least a part of the conductive layer extends to a portion of the closing member body facing an extending part of the holding section, the conductive layer extends about an entire perimeter of the closing member body, wherein the closing member body has an inner surface, an outer surface, a side surface immediately adjacent the inner surface, and an outwardly facing surface that connects the side surface and with the outer surface, wherein the interposition member has an inner portion that extends along the inner surface of the closing member body, a side portion that extends along the side surface of the closing member body, and an outwardly facing portion that extends along the outwardly facing surface of the closing member body, the conductive layer extends along an interface between the outwardly facing portion of the interposition member and the outwardly facing surface of the closing member body, the conductive layer extends along an interface between the side portion of the interposition member and the side surface of the closing member body, and the conductive layer does not extend along an interface between inner portion of the interposition member and the inner surface of the closing member body.

11. The closing member according to claim 10, wherein the extending part of the holding section is inclined.

12. The closing member according to claim 10, wherein the interposition member is provided with a volume resistivity of at least 5 Ωcm.

13. The closing member according to claim 10, wherein the conductive layer is a water-soluble paint with conductivity.

14. The closing member according to claim 10, wherein the conductive layer is a water-soluble paint with conductivity which is applied to the closing member body.

* * * * *